US00RE34583E

United States Patent [19]

Grief et al.

[11] E Patent Number: Re. 34,583

[45] Reissued Date of Patent: Apr. 12, 1994

[54] METHOD OF FORMING A CONFIGURATION OF INTERCONNECTIONS ON A SEMICONDUCTOR DEVICE HAVING A HIGH INTEGRATION DENSITY

[75] Inventors: Malcolm K. Grief; Trung T. Doan, both of Boise, Id.; Hendrikus J.W. Van Houtum; Josephus M.H.L. Van Laarhoven, both of Eindhoven, Netherlands

[73] Assignee: U.S. Philips Corporation, New York, N.Y.

[21] Appl. No.: 880,860

[22] Filed: May 11, 1992

Related U.S. Patent Documents

Reissue of:

[64] Patent No.: 4,936,950
Issued: Jun. 26, 1990
Appl. No.: 339,029
Filed: Apr. 14, 1989

[30] Foreign Application Priority Data

Apr. 22, 1988 [FR] France ..... 88 05391

[51] Int. Cl.[5] ..... H01L 21/306; B44C 1/22; C23F 1/00; C03C 15/00

[52] U.S. Cl. ..... 156/643; 156/644; 156/646; 156/653; 156/657; 156/659.1; 156/662; 257/750; 437/192; 437/203

[58] Field of Search ..... 156/643, 644, 646, 653, 156/656, 657, 659.1, 662; 437/203, 246, 194; 357/71

[56] References Cited

U.S. PATENT DOCUMENTS

| | | | |
|---|---|---|---|
| 4,184,909 | 1/1980 | Chang et al. | 437/192 X |
| 4,361,599 | 11/1982 | Wourms | 437/192 X |
| 4,484,978 | 11/1984 | Keyser | 156/653 X |
| 4,536,249 | 8/1985 | Rhodes | 156/653 X |
| 4,624,864 | 11/1986 | Hartmann | 437/193 X |
| 4,640,738 | 2/1987 | Fredericks et al. | 156/656 |
| 4,981,550 | 1/1991 | Huttemann et al. | 437/194 X |

FOREIGN PATENT DOCUMENTS 0165085 12/1985 European Pat. Off. .

*Primary Examiner*—William A. Powell
*Attorney, Agent, or Firm*—Norman N. Spain

[57] ABSTRACT

A method of the kind consisting in that a contact is obtained with an active zone (11) carried by a semiconductor substrate (10) by means of conductive contact studs (18a) located in the contact openings (16c) of an isolating layer (12) and in that then a metallic configuration of interconnections (22) is formed establishing the conductive connection with the conductive contact studs (18a). A separation layer (13) is provided between the isolating layer (12) and the conductive layer (18), which can be eliminated selectively with respect to the isolating layer (12). Thus, the isolating layer (12) retains its original flatness and the conductive contact studs (18a) have an upper level (20) exceeding slightly the level (21) of the isolating layer (12), thus favoring the contact between these contact studs (18a) and the metallic configuration of interconnections (22). Application in microcircuits having a high integration density.

6 Claims, 2 Drawing Sheets

METHOD OF FORMING A CONFIGURATION OF INTERCONNECTIONS ON A SEMICONDUCTOR DEVICE HAVING A HIGH INTEGRATION DENSITY

Matter enclosed in heavy brackets [ ] appears in the original patent but forms no part of this reissue specification; matter printed in italics indicates the additions made by reissue.

BACKGROUND OF THE INVENTION

The invention relates to a method of forming a configuration of interconnections on a semiconductor device, more particularly an integrated circuit, this method comprising the following steps:

(a) forming an insulating layer on the substrate, in which the elements of the device are provided, (b) etching narrow contact openings into this insulating layer, (c) depositing at least one layer of conductive material by means of a method ensuring a good coverage, inclusive of the inner surface of the contact openings, the overall thickness of said layer being sufficient to fill the volume of the contact openings, (d) removing by etching the major part of the conductive material to expose the surface of the insulating layer, but to maintain the material in the contact openings, (e) depositing a metallic interconnection layer and etching it into the form of the desired configuration.

The semiconductor technology shows a constant development towards an increasingly higher integration of the number of elementary parts in the same monolithic circuit.

For this purpose and in order to increase the speed of operation of the circuits, there is a tendency to reduce as far as possible the dimensions of the elementary parts. The conventional techniques of forming contacts on the semiconductor devices used until recently contact zones and interconnection lines whose lateral dimensions most frequently were considerably larger than the thickness of the metallic layer constituting the said lines. As far as the manufacture of circuits having a high integration density is concerned, it is on the contrary necessary to provide contact openings whose diameter is of the same order as the thickness of the insulating layer, in which these contact openings are formed. In this connection, reference is frequently made to the ratio between the depth and the diameter of the contact openings designated as "aspect ratio", which, when this ratio is close to 1 or even larger, indicates that the known techniques of forming contacts based especially on the simple deposition of an aluminum layer can no longer be used successfully.

Thus, the method mentioned in the opening paragraph has been proposed to provide a solution suitable for the formation of a configuration of interconnections on a circuit having a high integration density, in which the contact openings have an aspect ratio close to or larger than 1.

A method of this kind is known from the document EP-A-0 165 185. Among the conductive materials intended for filling the contact openings, titanium and tungsten are mentioned. It is otherwise known that a particularly interesting solution from the viewpoint of performances: especially a low electrical resistance and a good mechanical behaviour, consists in that first a thin layer of titanium-tungsten alloy is used as adhesion and covering layer for the whole surface and then a thick layer of tungsten is formed for effectively filling the contact openings.

The method generally used for depositing the tungsten layer for filling the contact openings is that designated as low-pressure chemical vapour deposition (LPCVD) method.

In fact this method ensures a good coverage of the whole surface from the layer of Ti-W alloy serving to activate the nucleation of deposition of tungsten. The filling of the contact openings is obtained when the thickness of the deposited layer is at least equal to half the diameter of these openings.

According to this method, after etching the layer of tungsten in such a manner that only the parts of this layer contained within the contact openings are maintained, it is observed that the upper surface of the insulating layer thus exposed frequently has a more or less pronounced roughness which can be irregularly disturbed over the substrate.

This degradation of the flatness of the surface of the insulating layer seems to be associated with the formation of micro-crystals in the layer of conductive material serving for filling the contact openings. In fact, this layer is necessarily fairly thick and is therefore obtained in conditions which promote a comparative high rate of deposition in such a manner that the method remains economical.

During the step of etching the conductive material, it is common practice that the etch employed is not selective with respect to the material of the insulating layer and that there is therefore a tendency to attack a superficial fraction of said insulating layer in order to guarantee the complete elimination of the conductive material everywhere except in the contact openings.

The surface roughness is then associated with the insulating layer.

The continuation of the manufacturing process of the semiconductor device is seriously disturbed by the appearance of this fault. In fact, the surface roughness of the insulating layer influences the crystallization of the metallic interconnection layer generally made of aluminum, which subsequently covers it and result in a reduction of the resistance to electromigration of this metallic layer.

On the other hand, the roughness is also reproduced at the surface of the metallic layer and during the operation of photomaking this layer leads to a substantial degradation of the optical definition of the masque of lacquer to be formed for locally etching the metallic layer.

SUMMARY OF THE INVENTION

Thus, the invention has for its object to provide an improvement of the indicated method such that the aforementioned difficulties are avoided.

According to the invention, a method of forming a configuration of interconnections on a semiconductor device, more particularly an integrated circuit, comprises the following steps:

(a) forming an insulating layer on substrate, on which the elements of the device are provided, (b) etching narrow contact openings into this insulating layer, (c) depositing at least one layer of conductive material by means of a method ensuring a good coverage inclusive of the inner surface of the contact openings, the overall thickness of this layer being sufficient to fill the volume of the contact openings, (d) removing by etching the major part of the conductive material to expose the surface of the insulating layer, but to maintain material in the contact openings, (e) depositing a metallic interconnection layer and etching it into the form of the desired configuration, and is characterized in that, before the contact openings are etched (before the aforementioned step b), the insulating layer is covered by a so-called separation layer of such a kind that it can be etched selectively with respect to the insulating layer and in that openings corresponding to the contact openings are etched into the separation layer, whereupon the steps of method indicated at b, c and d are effected, and in that, before the metallic interconnection layer is deposited (step e), the separation layer is selective eliminated.

Since the separation layer is eliminated selectively with respect to the insulating layer, not a single surface irregularity that may be carried by the separation layer can be transmitted by etching to the surface of the insulating layer, which retains its original flat state.

DETAILED DESCRIPTION OF THE PREFERRED EMBODIMENTS

Figure 1:
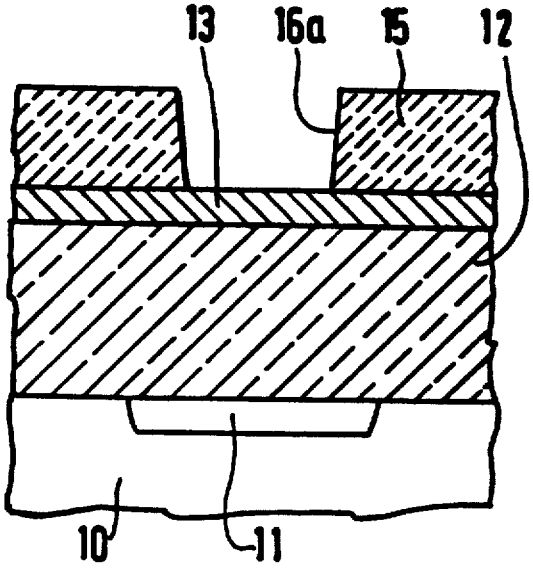
FIGS. 1, 2, 3*a*, 4*a* and 5*a* show diagrammatically and in sectional a part of the semiconductor during various successive stages of the method according to a first embodiment of the invention.

According to an advantageous embodiment of the invention, the separation layer is chosen so that is can be eliminated selectively with respect to the conductive filling material. Thus, by the value of the thickness given to the separation layer there is a parameter which permits of adjusting after removal of the major part of the conductive material the upper level of the remaining parts of this material in the contact openings with respect to the level of the surface of the insulating layer. It has in fact been found that the quality and the regularity of the contacts obtained by the aforementioned method depended for a substantial part upon the fact that the level of the parts of the conductive material is not lower than the level of the adjacent insulating layer and that these parts of conductive material on the contrary form a protuberance having a controlled value, which facilitates a low-resistance contact with the metallic layer subsequently covering it.

According to a first detailed embodiment of the invention, the method is characterized in that the insulating layer is formed by a silica glass, the filling material is formed by tungsten or an alloy rich in tungsten and the separation layer is formed by silicon nitride.

In this case, with respect to the choice of the thickness of the separation layer, the superficial fraction of this layer which will be eliminated during the continued step of etching the tungsten layer when this attack is slightly prolonged in order to take into account small operating tolerances, which are in practice inevitable, should be taken into account.

The etching selectivity of silicon nitride with respect to silica glass permits eliminating the separation layer, which leaves the surface of the insulating layer in its original state, i.e. devoid of roughness.

According to a second embodiment of the invention, the method is characterized in that the separation layer is chosen to be of such a kind that the conductive filling material can be etched selectively with respect to the separation layer, which is used during the step of etching the conductive material (step d of the method) as an etch-stopping layer.

According to this embodiment, the separation layer is practically not consumed at the end of the elimination of the conductive material and the elimination of the roughness of the surface is obtained from this stage of the method.

According to an advantageous variation of this second embodiment, during the step of etching the contact openings, the separation layer is etched selectively, this layer serving as an additional mask for etching the insulating layer. Since precisely contact openings should be formed having a high aspect ratio for which practically vertical walls of the openings should be obtained, advantageous anisotropic attacking conditions can be chosen, in which the separation layer plays the part of a mask having a higher resistance than the mask of photoresist used in initially for defining the openings in the separation layer.

According to a preferred variation of the second embodiment of the invention, the method is characterized in that, the filling conductive material is formed by tungsten or an alloy rich in tungsten and the separation layer is formed from one of the metals aluminum, an alloy of aluminum or cobalt.

In order that the invention may be readily carried out, it will now be described more fully, by way of example, with reference to the figures accompanying drawing.

The method according to the invention relates to the manufacture of a configuration of interconnections on a semiconductor device, of which a part shown diagrammatically in FIG. 1.

The different active elements of an integrated circuit have been formed in a substrate 10 of, for example, silicon, the different stages of the method to be described serving to form an electrical contact with an active region 11 of the device, which may be, for example, a source or drain region of a field effect transistor of the MOS type. An insulating layer 12 most frequently made of silica glass that may be doped with phosphorous or boron is formed on the substrate 10.

In order to ensure a suitable insulation of the configuration of interconnections which will subsequently be carried by the insulating layer 12 and in order to reduce to a minimum the parasitic capacitance of this configuration with respect to the substrate, the insulating layer 12 has a comparatively large thickness, of the order of 0.8 to 1 μm.

According to the method of the invention, the insulating layer 12 is covered with a so-called separation layer 13 of such a kind that it can be etched selectively with respect to the insulating layer 12. In accordance with the material chosen to form the separation layer 13, the thickness of this layer can be varied, but nevertheless it generally lies between 50 nm and 300 nm. The assembly of the device has then been covered with a photoresist mask 15, in which openings 16*a* are formed at the areas at which contacts have to be provided.

Figure 2:
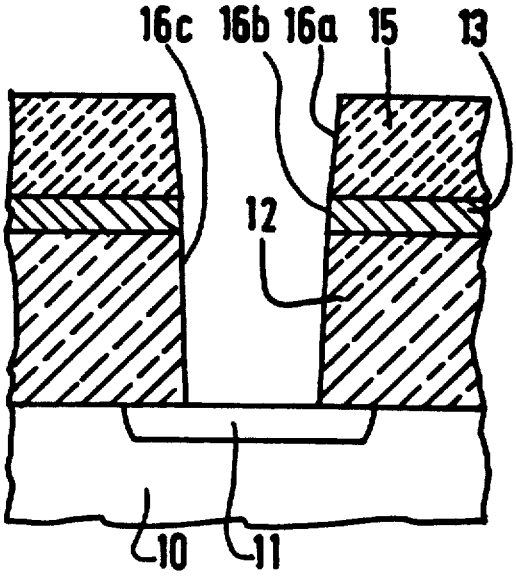

As is shown in FIG. 2, by means of the mask 15 an opening 16*b* is etched into the separation layer 13 and then an opening 16*c* is etched into the insulating layer 12, the opening 16*c* having a depth such that the surface of the active region 11 is esposed. In order to limit as far as possible the volume of the elements of the integrated device, the diameter of the contact openings, such as 16*c*, is for example, 0.8 μm so that these openings have an aspect ratio equal to or slightly larger than 1. In order to obtain contact openings 16*c*, whose walls are practically vertical, an anisotropic etching method is used which is known as "reactive ion etching". For etching the opening 16*b* into the separation layer 13, use is made of an etching technique directly associated with the kind of the material chosen to form this layer, further details about this technique being given below.

However, it should be noted that the separation layer 13 has a thickness such that the opening 16*b* formed therein has an aspect ratio considerably smaller than 1 and that consequently the angle of the walls of this opening 16*b* is not so important as for the opening 16*c* in the insulating layer 12.

Figure 3A:
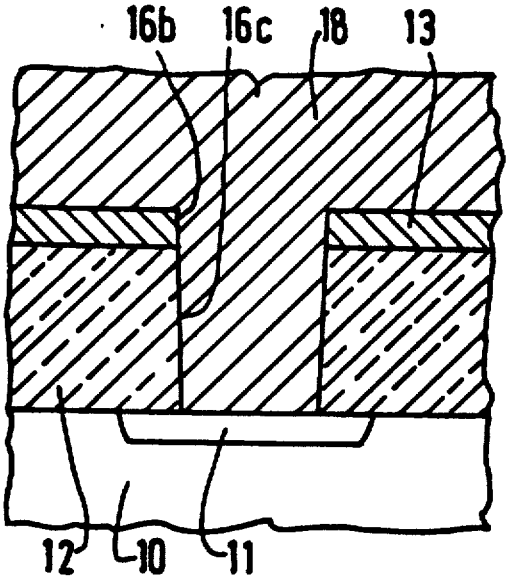

Reference is now made in FIG. 3A, which corresponds to the stage of the method at which a layer of conductive material 18 is deposited having a sufficient thickness so that the contact openings 16*b*, 16*c* are entirely filled with this conductive material. For this purpose, a method is used known to ensure a good coverage of the surface, inclusive of the inner surfaces of the contact openings. Among these known methods is the so-called low-pressure chemical vapour deposition (LPCVD) method or atmospheric pressure chemical vapour deposition method (CVD). As conductive material 18 tungsten, an alloy of tungsten an titanium, an alloy of tungsten and silicon or highly doped polycrystalline silicon to be sufficiently conducting can be chosen.

Figure 4A:
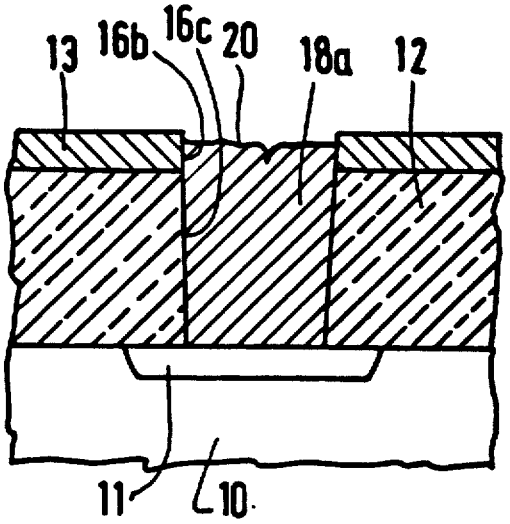

The following operation consisting in removing by etching the major part of the conductive material 18 is shown in FIG. 4A. The conductive material 19 is preferably etched in a plasma, whose kind depends upon the kind of the conductive material used. In the case of tungsten or of an alloy of tungsten or of an alloy rich in tungsten, for example, a plasma of sulphur hexafluoride ($SF_6$) can be used. Since it is attempted to expose entirely the surface of the separation layer 13 so that only elements 18*a* of the local conductive material within the contact openings 16*c* are maintained, it is necessary to slightly prolong the attack in order to take into account possible tolerances of the thickness of the conductive material 18 or slight variations in the operating conditions. In accordance with the kind of the separation layer 13 and its more or less high resistance to this attack, the level of the element 18*a* of the conductive material can therefore be situated slightly below the level of the separation layer 13 at the end of the etching step. The termination of the attack is defined either by an accurate control of the etching time or by an arbitrary detection means especially utilizing the variation in intensity of a specific jet emitted by the plasma.

Figure 5A:
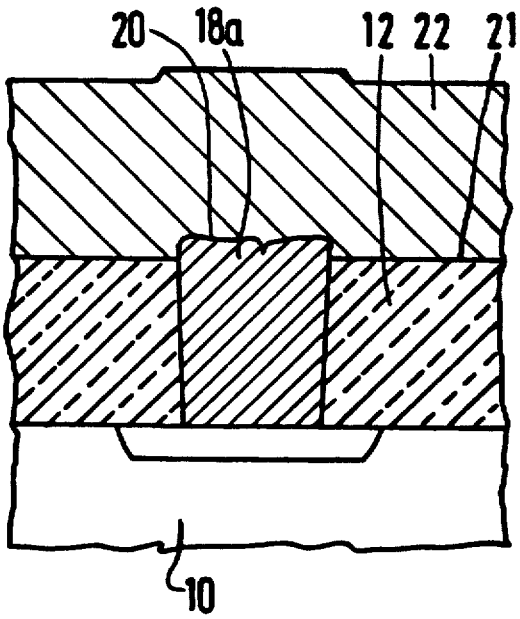

The following operation consisting in eliminating the separation layer 13 is carried out selectively with respect to the insulating layer 12. Consequently, the surface of the insulating layer 12 thus exposed is devoid of any irregularity independently of the possible roughness of the surface of the separation layer 13. Advantageously, the material of the separation layer 13 will be chosen so that it can be eliminated selectively with respect to the conductive material 18. Thus, as shown in FIG. 5A, the upper level 20 of the element 18*a* of conductive material may be made higher, if desired, with respect to the level 21 of the surface of the insulating layer 12. Such a shift is obtained by differences with respect to the thickness of the separation layer 13, which is eliminated.

According to a first practical embodiment of the invention, the separation layer 13 is made of silicon nitride ($Si_3N_4$). At the end of the attack of the layer of conductive material 18, the separation layer 13 does not exhibit an etching barrier, but is on the contrary attacked at a rate which is of the same order as the rate of attack of the conductive material 18 in the case in which this material is tungsten or an alloy rich in tungsten. A thickness of the separation layer 13 has to be chosen which corresponds to the time for which the etching of the layer of conductive material 18 is prolonged because a superficial part of the separation layer 13 will be etched during this prolongation of the etching treatment. By way of example, a thickness of 150 to 300 nm for the separation layer 13 of $Si_3N_4$ has proved to be suitable. Since silicon nitride can be etched selectively both with respect to silica glass and with respect to tungsten while wet wet etching with hot phosphoric acid, such a method is used for removing the separation layer 13 and producing in this manner the level difference indicated in FIG. 5A between the top 20 of the element 18*a* conductive filling material of the contact opening and the level 21 of the insulating layer 12. By controlling on the one hand the time of prolongation of the etching treatment of the layer of conductive material 18 and on the other hand the thickness of the separation layer 13, if can readily be ensured that the level 20 of the element 18*a* of conductive filling material is equal to the level of the surface 21 of the insulating layer 12 or that this level exceeds the latter level by a small given height. It has in fact been found that in these conditions the most favourable results are obtained with respect to the contact resistance between the elements 18*a* of conductive filling material and the metallic interconnection layer 22 subsequently deposited on the structure.

The metallic layer 22 is formed, for example, from aluminum or an alloy of aluminum-silicon in a thickness of approximately 1 μm, in which layer the configuration of interconnections is formed by the conventional photomasking and etching methods.

According to another embodiment of the invention, the material used for forming the separation layer 13 is of such a kind that the conductive material 18 can be etched selectively with respect to this separation layer 13. In this case, use is preferably made of aluminum or an alloy of aluminum or of cobalt. At the stage of the method consisting in removing by etching the major part of the conductive material 18, the separation layer 13 then constitutes a blocking layer at the end of this etching step. When the attack of the conductive material 18 is prolonged, the separation layer 13 is not attacked. Therefore, the thickness chosen for this layer can be slightly smaller than in the preceeding embodiment. Thus, a thickness chosen to lie between 50 and 150 nm is particularly suitable. When the separation layer 13 is formed from the aluminum or from an alloy of aluminum, it can be removed selectively with respect to the insulating layer 12 and with respect to the conductive filling material 18 by means of dry etching in a plasma rich in chlorine ions. It can also be realized by wet etching in a mixture of phosphoric acid, acetic acid and nitric acid frequently used by those skilled in the art.

When the separation layer 13 is made of cobalt, in order to eliminate selectively this layer, a wet etching treatment is carried out.

According to a particularly advantageous embodiment of the invention, the selectively of etching the separation layer 13 with respect to the insulating layer 12 is utilized during the step of etching the contact openings 16*c*. In fact, etching conditions can be chosen in the insulating layer 12 which are such that the separation layer 13 is not attacked and thus serves as an additional mask for etching the contact openings 16*c*. When the separation layer 13 is made of aluminum or of cobalt and, after having formed an opening 16*b* in this layer while using a suitable etching step in the presence of the photoresist mask 15 (see FIG. 2), the openings 16*c* are etched through the insulating layer 12. As indicated above, this etching step is preferably effected by reactive ion etching, the ions employed being rich in cloride, for which etching step the separation layer 13 with its opening 16*b* constitutes a mask having a higher resistance to this etching step than the photoresist mask itself. The latter may be removed before the contact openings are etched, but it may also be maintained. By using a separation layer 13 as an additional mask for etching the contact openings 16*c* into the insulating layer 12, the step of etching narrow and deep contact openings like the formation of practically vertical walls of openings is facilitated.

Figure 3B:
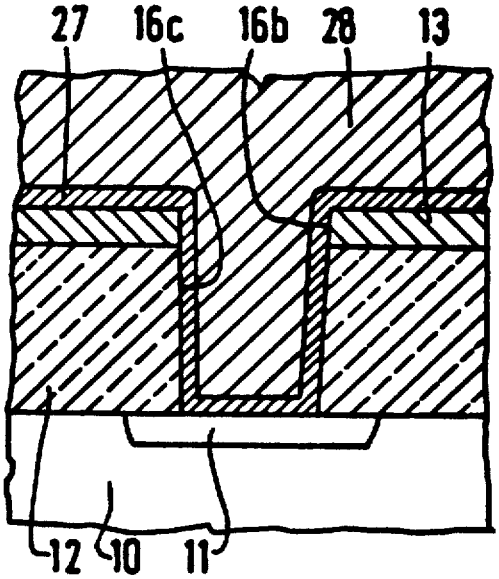
FIGS. 3*b*, 4*b* and 5*b* show views similar to those of FIGS. 3*a*, 4*a* and 5*a*, but of a second embodiment of the invention.

FIG. 3B shows a variation of the embodiment of the method according to the invention. In this variation, the contact openings 16*b*, 16*c* are filled with a conductive material by first depositing a thin layer of a titanium-tungsten alloy as an adhesion and covering layer on the whole surface, inclusive of the inner surface of the contact opening 16*c*, and then by carrying out the deposition of a thick layer 28 of tungsten, which ensures that the contact openings are effectively filled. As indicated above, the tungsten layer 28 is formed by low pressure chemical vapour deposition (LPCVD), while the layer of titanium-tungsten alloy 27 is deposited by cathode sputtering in a thickness of the order of 100 nm.

Figure 4B:
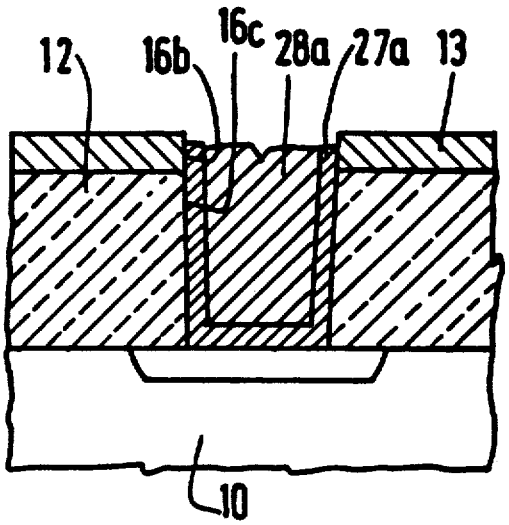

FIG. 4B corresponds to a subsequent stage of the method equivalent to that of FIG. 4A, in which the reference numerals corresponding to the similar elements are identical.

Figure 5B:
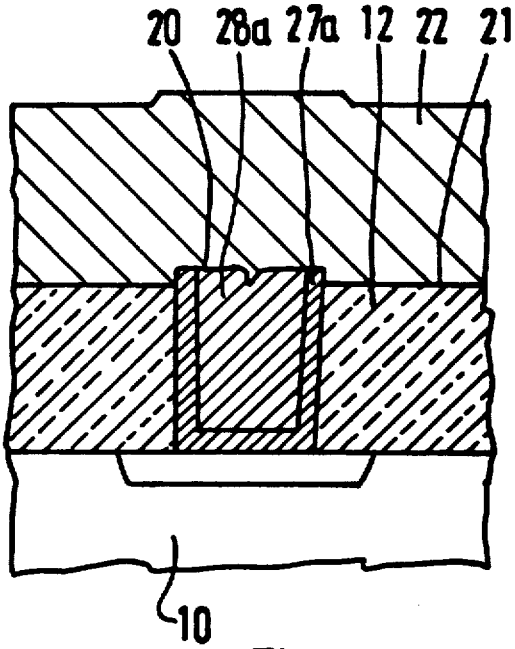

The major part of the conductive filling material 28 and the adhesion layer 27 have been removed from the surface of the separation layer 13 and only a part 27A and 28A located in the contact openings 16*c* is formed of these materials. The adhesion layer 27 of titanium-tungsten alloy is etched in the same conditions as the pure tungsten, one etching step following the other during the same plasma etching operation. The separation layer 13 therefore plays the same part as that described above with reference to FIG. 4A. FIG. 5B illustrates the subsequent stage of the method, which corresponds to that of FIG. 5A, in which the separation layer 13 has been removed, while a metallic interconnection layer 22 is disposed on the structure and is in contact with the local element of conductive material 28*a*, 27*a*. As described above, the removal of the separation layer 13 allows again the level 20 of the element 28*a* of the conductive filling material to be raised with respect to the level 21 of the insulating layer 12. In the variation described with reference to FIGS. 3B and 5B, the separation layer 13 can be formed from one of the materials already mentioned above, i.e. silicon nitride, aluminum, an alloy of aluminum or of cobalt.

The method according to the invention is not limited to the manufacture of a structure of interconnections on an integrated circuit comprising a MOS transistor; it has more generally for its object to form contacts on any kind of semiconductor device when contact zones and contact openings of very small dimensions should be used.

We claim:

1. A method of manufacturing a configuration of interconnections on a semiconductor device, said method comprising:

(a) forming an insulating layer on a substrate[,] provided with said semiconductor device, (b) providing said insulating layer with a separation layer capable of being etched selectively *with respect to said insulating layer so* as to form openings corresponding to contact openings to be etched into said insulating layer, (c) selectively etching said openings corresponding to said contact openings into said separation layer, (d) etching said [narrow] contact openings into said insulating layer *through said openings in said instant separation layer,*

(e) depositing at least one layer of conductive material, having an overall thickness which is sufficient to fill the volume of said contact openings, *in said contact openings and* on said separation layer, (f) selectively removing, by etching, the major part of said conductive material and said underlying separation layer to thereby expose the surface of said insulating layer while maintaining said conductive layer [and said portion layer] in said contact openings, [(g) selectively removing said separation layer from said contact openings, and h)]

(g) *depositing a metal interconnection layer on said insulating layer and on said conductive layer in said contact openings* and etching said metallic interconnection into a desired configuration.

2. A method as claimed in claim 1, characterized in that the separation layer is chosen so that it can be eliminated selectively with respect to the conductive filling material.

3. A method as claimed in claim 2, characterized in that the insulating layer is formed from a silica glass, the conductive filling material is formed from tungsten or an alloy rich in tungsten and the separation layer is formed from silicon nitride.

4. A method as claimed in claim 2, wherein the separation layer is chosen of the materials such that the conductive filling material can be etched selectively with respect to the separation layer and the separation layer is employed as an etch-stopping layer in the step in the method wherein the major part of the conductive material is etched to expose the surface of the insulating layer while the conductive material is maintained in the contact openings.

5. The method of claim 4, wherein during the step of etching the contact openings the separation layer is etched selectively and is used as an additional mask for etching said insulating layer.

6. A method as claimed in claim 5, characterized in that, the conductive filling material is formed from tungsten or an alloy rich in tungsten and the separation layer is formed from one of the metals: aluminum alloy or cobalt.

* * * * *